(12) United States Patent
Cases et al.

(10) Patent No.: US 8,564,322 B2
(45) Date of Patent: Oct. 22, 2013

(54) RECEIVER SIGNAL PROBING USING A SHARED PROBE POINT

(75) Inventors: Moises Cases, Austin, TX (US); Bhyrav M. Mutnury, Austin, TX (US); Nam H. Pham, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 656 days.

(21) Appl. No.: 12/642,914

(22) Filed: Dec. 21, 2009

(65) Prior Publication Data

US 2011/0149740 A1 Jun. 23, 2011

(51) Int. Cl.
*G01R 31/28* (2006.01)

(52) U.S. Cl.
USPC ............ 324/762.01; 324/762.02; 324/762.03; 324/762.06

(58) Field of Classification Search
USPC ......................................... 324/754.01–762.1
See application file for complete search history.

(56) References Cited

U.S. PATENT DOCUMENTS

| | | | |
|---|---|---|---|
| 5,065,090 A | 11/1991 | Gheewala | |
| 5,160,779 A | 11/1992 | Sugihara | |
| 5,818,252 A * | 10/1998 | Fullman et al. .......... | 324/762.04 |
| 6,094,056 A | 7/2000 | Bardsley et al. | |
| 6,275,051 B1 | 8/2001 | Bachelder et al. | |
| 6,581,174 B2 | 6/2003 | Stubbs | |
| 6,597,164 B2 | 7/2003 | Olson | |
| 6,774,656 B2 | 8/2004 | Baur et al. | |
| 7,019,532 B2 * | 3/2006 | Glockner et al. ............. | 324/543 |
| 7,049,839 B1 * | 5/2006 | Hsiao et al. ................. | 324/750.3 |
| 7,200,930 B2 | 4/2007 | Khandros et al. | |
| 7,262,620 B2 | 8/2007 | de la Puente et al. | |
| 7,342,404 B2 * | 3/2008 | Schmid et al. ........... | 324/762.02 |
| 7,403,028 B2 | 7/2008 | Campbell | |
| 7,443,180 B2 * | 10/2008 | Cases et al. .............. | 324/756.05 |
| 8,214,781 B1 * | 7/2012 | Liu et al. ........................ | 716/106 |
| 2001/0037183 A1 * | 11/2001 | Aslami .......................... | 702/115 |
| 2004/0150385 A1 * | 8/2004 | Schroeder et al. ........ | 324/117 R |
| 2005/0193296 A1 | 9/2005 | Chien | |
| 2008/0136427 A1 | 6/2008 | Cases et al. | |
| 2008/0180116 A1 * | 7/2008 | Fujiwara et al. .............. | 324/754 |
| 2008/0238453 A1 * | 10/2008 | Lo et al. ........................ | 324/754 |
| 2009/0090908 A1 * | 4/2009 | Cases et al. ..................... | 257/48 |

FOREIGN PATENT DOCUMENTS

JP 2000304773 A 11/2000

OTHER PUBLICATIONS

Jones, et al., "JP2000304773A Nov. 2, 2000 Packaging and Interconnecting of Contact Structure (en)", English abstract of JP2000304773A, Nov. 2, 2000, 27 pages.

* cited by examiner

*Primary Examiner* — Jermele M Hollington
*Assistant Examiner* — Adam Clarke
(74) *Attorney, Agent, or Firm* — Thomas E. Tyson; Jeffrey L. Streets

(57) ABSTRACT

A device and method are disclosed wherein a receiver signal line within an integrated circuit may be selected for probing. In one embodiment, a plurality of signal pads and a test pad are provided on an external surface of an integrated circuit chip. A plurality of signal lines extends through the integrated circuit chip to the signal pads. A multiplexer on the integrated circuit chip is configured for individually selecting any of the signal lines. An amplifier on the integrated circuit chip amplifies a selected signal and communicates the amplified signal to an externally-accessible test pad to be probed.

8 Claims, 3 Drawing Sheets

RECEIVER SIGNAL PROBING USING A SHARED PROBE POINT

BACKGROUND

1. Field of the Invention

The present invention relates to assessing integrity of a high speed signal at a receiver on an integrated circuit chip.

2. Background of the Related Art

Clock frequencies of computer systems continue to increase, leading to a corresponding increase in the input/output (I/O) frequencies in today's high speed computer systems. Various interfaces in a high speed system, such as multi-drop interfaces like memory (e.g. DDR-3) and serial interfaces such as PCIe (Peripheral Component Interconnect Express), SAS (Serial Attached SCSI), and GbE (Gigabit Ethernet), are capable of transferring data on the order of Gigabits per second. Assessing the signal integrity at the receiver, in terms of characteristics such as rise time and fall time, is an important part of verifying the expected operation of a chip. However, performing measurements on such high speed systems is increasingly challenging, particularly due to anomalies that can occur at higher signal speeds, such as signal reflections.

Accurately measuring a signal received in a chip is challenging because the signal is typically received at a point that is internal to the chip package, and is not directly accessible to peripheral testing equipment. To measure the signal, the signal is typically conducted from a pad on the chip to a corresponding package pin, and the signal is probed at the pin rather than directly on the chip. When probing at the package pin in a conventional manner, the resultant measurement is not a true representation of the original signal waveform as it is received at the chip. For example, measurements at the package pin may show artifacts that are not actually present at the receiver pad. For example, such artifacts may manifest as a slope reversal, which may be significant enough to obscure the correct interpretation of the signal.

BRIEF SUMMARY

According to one embodiment of the present invention, an electronic device includes an integrated circuit chip, with a plurality of signal pads and a test pad on an external surface of the chip. A plurality of signal lines each extend through the integrated circuit chip to the signal pads. A multiplexer on the chip is internally connected to the signal lines and is configured for individually selecting any of the signal lines. An amplifier on the integrated circuit chip is in communication with the multiplexer for amplifying a signal carried on the selected signal line and communicating the amplified signal to the test pad.

Another embodiment of the invention provides method of testing a chip. A plurality of signals are transmitted to a chip of a chip package, one of which is selected to probe. The selected signal is amplified internally to the chip. The amplified signal is communicated to an external probe point of the chip package. The amplified signal is then probed at the external probe point.

DETAILED DESCRIPTION

Embodiments of the present invention include a system and method for probing an internal receiver signal line in an integrated circuit chip for evaluating a signal carried on the probed signal line. A multiplexer is uniquely provided on along with the receiver to allow for any one of multiple signal lines to be individually selected for probing. A single probe point is coupled to the output of the multiplexer for measuring the signal received on any one of multiple signal lines in the chip. The multiplexer may be controlled remotely using control lines on a bus. An accurate measurement of the signal received by the receiver within the integrated circuit chip is obtained due, in part, to the use of an op-amp to amplify the selected signal output of the multiplexer. The op-amp has a high-impedance and a correspondingly low current flow that minimizes artifacts in the op-amp output. Accordingly, the op-amp output signal does not have the resonance, signal reflections, and slope reversal artifacts that are present when using a conventional system to probe a package pin.

Figure 1:
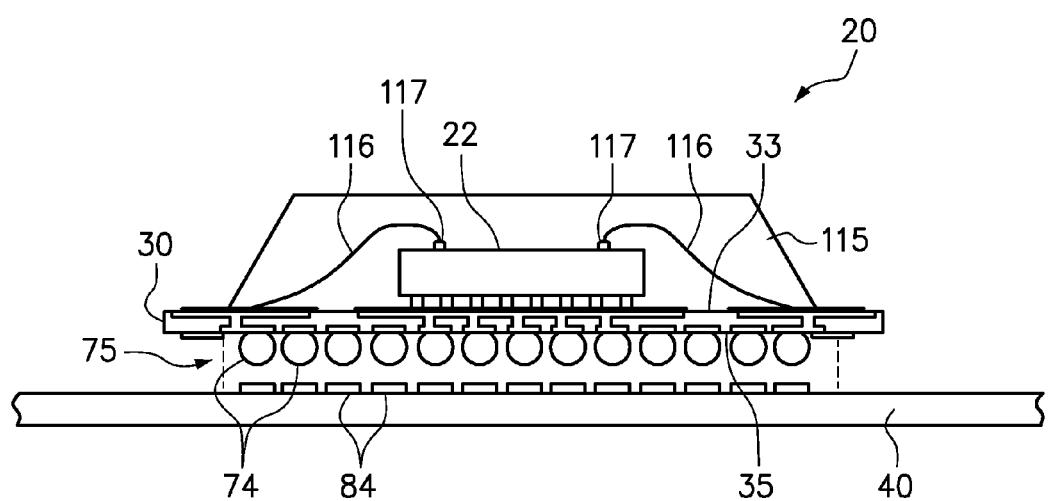
FIG. 1 is a schematic diagram of an example of a chip package in which signals at a receiver can be evaluated according to an embodiment of the invention.

FIG. 1 is a schematic diagram of an example of a chip package 20 in which signals can be evaluated according to an embodiment of the invention. The chip package 20 may be selectively coupled to a surface of a printed circuit board (PCB) 40. The package 20 includes an integrated circuit chip 22, such as a processor or an application specific integrated circuit (ASIC), secured to a chip side 33 of a package substrate 30. Although not required, the chip 22 may be enclosed in a protective housing 115, such as molded plastic encapsulating the chip 22. The chip 22 is electrically connected to the package substrate 30 from the top of the chip 22 using bond wires 116 (only two of many are shown). The bond wires 116 may be connected at one end to bond pads 117 on the chip 22 and at the other end to traces on the package substrate 30. A plurality of signal contacts, embodied here as solder balls 74 of a ball grid array 75, are provided on a board side 35 opposite the chip side 33 of the package substrate 30. The chip 22 is electrically connected through the package substrate 30 to the ball grid array 75. The array of balls 74 in the ball grid array 75 are aligned for contact with corresponding electrical contacts or pads 84 on the PCB 40. The balls 74 may be heated to melting or softening while in contact with the electrical pads 84 on the PCB 40, and then cooled to secure the ball grid array 75. As an alternative, pins or other electrical contacts may be provided on the board side 35 of the package substrate 30 in lieu of the ball grid array 75, with an appropriate choice of electrical contacts on the PCB 40 for mating with the pins or other electrical contacts on the PCB 40.

Figure 2:
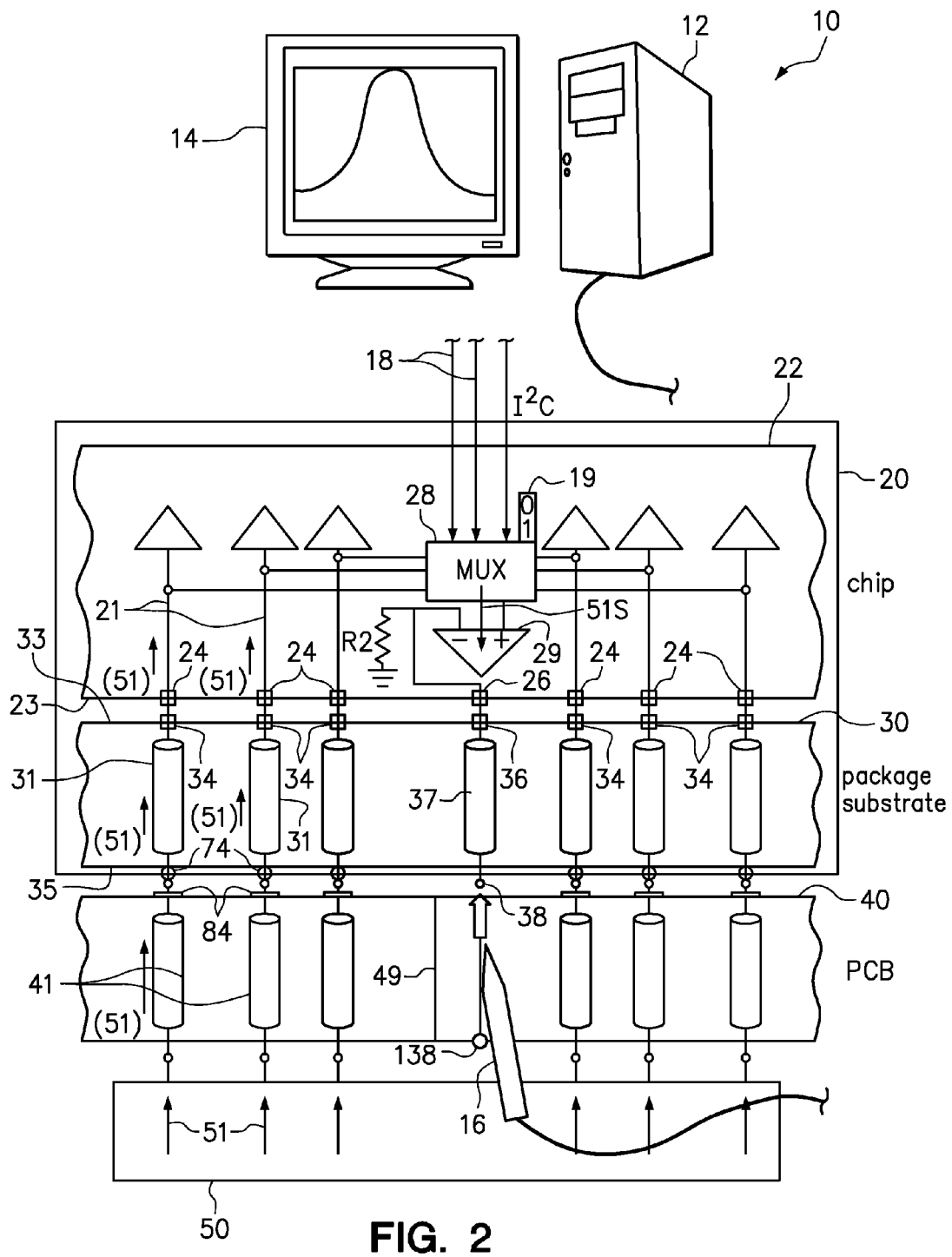
FIG. 2 is a schematic diagram of a circuit board testing system interfaced with a chip package for evaluating signals at a receiver in a chip.

FIG. 2 is a schematic diagram of a circuit board testing system 10 interfaced with the chip package 20 of FIG. 1 for measuring signals in a receiver of an integrated circuit chip 22 within the chip package 20 according to an embodiment of the invention. The testing system 10 includes a computer 12 having a display 14 and a test probe 16 connected to the computer 12. The computer 12 may be a specialized computer system, a general purpose computer such as a PC, or a combination thereof. For example, the computer 12 may include a personal computer (PC) in communication with an oscilloscope, or having software for emulating signal-analysis features of an oscilloscope. The test probe 16 may be, for example, a co-axial test probe known in the art apart from its application to the present invention. The computer system 14 may include testing software or firmware. The firmware may include one or more software drivers for controlling the test probe 16 and one or more analysis modules for analyzing a signal on a probed signal line.

The chip package 20 is schematically shown and exaggerated in size for clarity. Only a representative portion of the chip package 20 is shown, as indicated by broken lines at either end. The chip package 20 may be, for example, a single-chip module (SCM), wherein the chip 22 is the only chip included with the chip package 20. Alternatively, the package 20 may be a multi-chip module (MCM), in which case one or more other chips (not shown) would also be included. The package 20 includes both the chip 22 and a package substrate 30 that supports the chip. The package substrate 30 and the supported chip 22 may be positioned, loosely or otherwise, in a socket as generally understood in the art apart from its application to the present invention for the purpose of coupling the package 20 on a printed circuit board (PCB) 40. The PCB 40 may be, for example, a motherboard or an expansion card. Alternatively, the PCB 40 may be a circuit board of a test fixture for temporarily interfacing with the chip package 20 during testing. However, the in-situ testing capabilities of the chip package 20 of the present invention allows the receiver within the chip to be tested while the chip package 20 is assembled to its end-product (such as to the motherboard of a computer system), without the use of a test fixture. The test fixture is, nonetheless, an option, as it may be convenient to test the chip 22 prior to final assembly to the end-product. Furthermore, it is optional to subsequently re-test the chip 22 after being installed in the end product.

The package substrate 30 has a chip side 33 facing the chip 22 and a board side 35 facing the PCB 40. The chip 22 is mounted to the package substrate 30 with the external surface 23 against the package substrate 30. The chip 22 has a plurality of signal pads 24 and at least one test pad 26 on the external surface 23. The package substrate 30 has a plurality of signal contacts 34 arranged for contacting respective signal pads 34 on the chip 22 and a test contact 36 positioned for contacting the test pad 26 on the mounted chip 22. The signal pads 24 and test pad 26 may be structurally similar to each other. The signal pads 24 and test pad 26 on the chip 22 may be, for example, plated conductive pads. Alternatively, the signals pads 24 and the test pad 26 may include pins. The signal contacts 34 and the test contact 36 on the package substrate 30 may also be conductive pads or other structure (e.g. pins) for electrically contacting the respective signal pads 24 and test pad 26 on the chip 22. Structurally, the signal pads 24 and test pad 26 on the chip 22 may be configured to mate with the corresponding signal contacts 34 and test contact 36 on the package substrate 30. For example, the signal pads 24 and test pad 26 on the chip 22 may alternatively be pins, and the signal contact 34 and test contact 36 on the package substrate 30 may be pin receptacles.

The package substrate 30 is supported on the PCB 40, with the board side 35 of the package substrate 30 optionally contacting the PCB 40. The conductive balls 74 of the ball grid array 75 on the board side 35 of the package substrate 30 are aligned for contacting conductive pads 84 on the PCB 40. A plurality of signal conductors 31 extend through the package substrate 30 from the chip side 33 of the package substrate 30, where respective signal conductors 31 are connected to the signal contacts 34, to the board side 35 the package substrate 30. The signal conductors 31 in the package substrate 30 are connected (e.g. by pins or other electrical contacts) to signal conductors 41 on the PCB 40.

Although the present invention is directed to probing signals at the receiver, it should recognized that the signals received on the signal conductors 41 may originate from a "driver device" 50. Generally, the driver device 50 is an electronic device that generates signals 51 received by the chip 22. The driver device may be, for example, an electronic component mounted to the PCB 40. More specifically, for example, the driver device 50 may be an application card having one or more logic chips, or a memory system having one or more memory chips. Alternatively, the driver device 50 may be another chip included instead with the chip package 20, such as in the case of an MCM. Although the chip 22 is shown as receiving the signals 51 in this example embodiment, one skilled in the art will appreciate that the chip 22 may both receive signals generated by the driver device 50 and alternately generate other signals (not shown) to be received by another chip in communication with the chip 22.

The driver device 50 generates a plurality of the signals 51, which are communicated through the respective signal conductors 41 on the PCB 40 and the signal conductors 31 on the package substrate 30 to signal lines 21 in the chip 22. Each signal line 21 carries its own signal 51. A multiplexer ("mux") 28 embedded in the chip 22 is internally connected to the signal lines 21. The multiplexer 28 is configured for individually selecting one of the plurality of signal lines 21 and communicating the signal carried on the selected signal line 21, alternately referred to as the probed signal 51S, to an amplifier (an op-amp in this embodiment) 29 embedded in the chip 22. The amplified signal is communicated along a test line 37 on the package substrate 30 to a probe point 38. The test line 37 may have a similar length to the length of the signal conductors 31 on the substrate 30. The probe point 38 is externally-accessible to the probe 16 for probing the signal line 21 carrying the probed signal 51S. A physical opening 49 may be provided on the PCB 40 so that the probe point 38 is externally-accessible by the probe 16 even though the chip package 20 may be mounted to the PCB 40. In another embodiment, the amplified signal may instead by conducted to an alternate probe point 138 on the PCB 40 that is accessible by the probe 16.

The probe point 38 thus allows access to the probed signal 51S for testing purposes, such as to evaluate the probed signal 51S in terms of rise time, fall time, and other measurable signal characteristics. The op-amp 29 provides a high impedance load to the probed signal 51S. The high-impedance effectively prevents or minimizes resonance at high frequencies, because there is little or no current through the test line 37. Thus, a truer representation of the signal waveform of the probed signal 51S as it occurs at the receiver is obtained. The probed signal 51S is optionally displayed on the display 14, such as by plotting the voltage of the probed signal as a function of time. The display 14 may be an oscilloscope display, which may show a graphical representation of the probed signal over time. The displayed signal may be used to verify the quality of the waveform, such as the absence of artifacts like slope reversal.

By using the multiplexer 28 to select which signal 51 is tested, any of the signal lines 21 may be tested using just a single probe point 38, rather than requiring a separate probe point for each signal line. This saves limited and valuable space on the package substrate 30 and elsewhere in the chip package 20. For example, a greater portion of the external surface 23 of the chip 22 and the chip side 33 and board side 35 of the package substrate 30 may be devoted to having a greater number of signal pads, signal pins, and other elements used to conduct a greater number of signals 51 between the driver device 51 and the chip 22.

At least two modes of operation may be provided, including a testing mode and a functional mode. In the testing mode, the multiplexer 28 is activated to select the signal line 21 for probing, and the op-amp 29 is active to amplify the signal on the selected receiver signal line and communicate the amplified signal to the probe point. The multiplexer 28 may be activated by the computer 12, such as by sending control signals to the chip 22 using control lines 18. The control lines 18 may be included on an I2C (Inter-Integrated Circuit) bus, for example. The computer 12 may control the multiplexer 28, such as by setting a register bit 19 (only one register bit 19 is shown, for simplicity). A separate register bit 19 may be included for each signal line 21. The probed signal 51S may be selected by setting the register bit 19 as a logical "1" for the signal line 21 on which the probed signal 51S is associated, and setting the register bits for the other signal lines 21 as a logical "0." In the functional mode, the multiplexer 28 may disable the probe point 38, so that none of the signals 51 are communicated to the probe point 38. In the functional mode, the chip 22 may process the signals 51 from the driver device 50 in a conventional manner.

In FIG. 2, only a single probe point 38 is required in order to test each of the plurality of signal lines 21 in the receiver. Any number of signal lines 21 may be associated with a single probe point. However, there may be a practical upper limit on the number of signal lines 21 that can be controlled with a single multiplexer. The chip 22 may include a far greater number of signal lines 21 to process a correspondingly greater number of signals 51 than what is included in the schematic diagram of FIG. 2. More than one probe point 38 may be included with the chip package 20, but wherein each single probe point is associated with a plurality of signal lines 51. For example, multiple instantiations of the portion of the chip package 20 shown in FIG. 2 may be included in the full chip package 20. While multiple probe points 38 would be included, each probe point 38 would allow access to more than one signal line 21, so that the total number of probe points 38 per chip package are still fewer than the number of signal lines 21 that may be probed.

Figure 3:
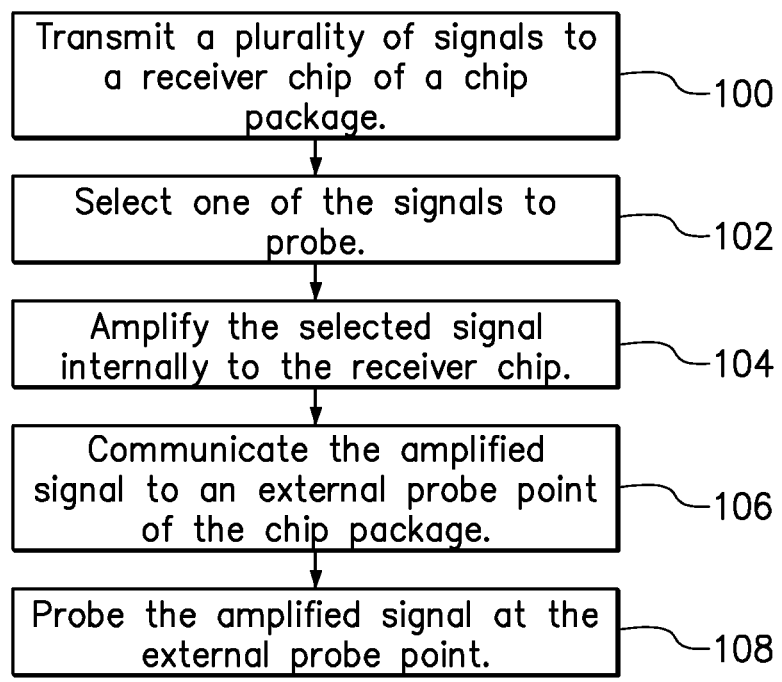
FIG. 3 is a flowchart outlining a method of testing signals at a receiver in a chip according to an embodiment of the invention.

FIG. 3 is a flowchart outlining a method of testing a chip according to an embodiment of the invention. The steps included in the flowchart may be further informed by reference to the above discussion of the testing system and chip package 20 of FIG. 2.

In step 100, a plurality of signals is transmitted to a chip of a chip package. The signals may be transmitted using a driver device, such as a component of a motherboard to which the chip package 20 is mounted or a driver chip included in the chip package. The signals may be transmitted through a package substrate to the chip.

In step 102, one of the signals is selected for probing. The signal may be selected, for example, by inputting a control signal to a multiplexer on the chip. The multiplexer is in communication with the plurality of signal lines. The control signal may set a bit corresponding to the chip signal line to be selected. One or more other bits may also be set to exclude the other signals on the other signal lines with which the multiplexer is in communication.

In step 104, the selected signal is amplified internally to the chip. To amplify the selected signal, the multiplexer may communicate the selected signal to an amplifier, such as an op-amp embedded on the chip, and the op-amp may amplify the selected signal. The op-amp may provide an impedance of between about 1 K ohm and 1000 K ohms.

In step 106, the amplified signal is communicated to an external probe point of the chip package. The external probe point may be included, for example, on an external surface of the package substrate that is accessible by a probe. The external probe point may alternatively be included on an external surface of a PCB to which the chip package may be mounted. The amplified signal may be communicated along signal conductors provided on the package substrate and the PCB. The signal conductors may include, for example, traces, vias, or a combination thereof.

In step 108, the amplified signal is probed at the external probe point. The amplified signal may be probed, for example, using a commercially-available probe connected to the computer of a laboratory testing system. The probed signal may be evaluated, such as to assess the probed signal for signal quality, including rise time, fall time, signal speed, and so forth.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An integrated circuit chip, comprising:
   a receiver including a plurality of signal lines extending from a plurality of signal pads on an external surface of the integrated circuit chip for receiving a digital signal;
   a multiplexer having a plurality of inputs and an output, wherein each input is internally connected to one of the plurality of signal lines on the integrated circuit chip, the multiplexer being changeable between a testing mode and a functional mode, wherein in the testing mode the multiplexer is activated to select any one of the plurality of inputs for probing and communicating the selected input to a single probe point on the external surface of the integrated circuit chip, and in the functional mode the multiplexer disables the single probe point so that none of the signals are communicated to the probe point; and
   an amplifier coupled to the multiplexer output for amplifying a signal carried on the selected signal line of the receiver and communicating the amplified signal to the probe point on the external surface of the integrated circuit when in the testing mode.

2. The integrated circuit of claim 1, wherein the plurality of signal pads comprise pads, pins, solder balls, or combinations thereof.

3. The integrated circuit of claim 1, wherein the plurality of signal lines comprise traces, vias, pads, or combinations thereof.

4. The integrated circuit of claim 1, wherein the amplifier is an operational amplifier.

5. The integrated circuit of claim 4, wherein the operational amplifier presents an impedance of between 1 K ohm and 1000 K ohms.

6. A system for testing signals at a receiver within an integrated circuit, comprising:

an integrated circuit chip including a receiver, a multiplexer and an amplifier, wherein the receiver has a plurality of signal lines extending from a plurality of signal pads on an external surface of the integrated circuit chip for receiving a digital signal, wherein the multiplexer has a plurality of inputs each internally connected to one of the plurality of signal lines, wherein the multiplexer is changeable between a testing mode allowing selection of any one of the plurality of inputs for probing and communicating the selected input to a single probe point on the external surface of the integrated circuit chip and a functional mode wherein the multiplexer disables the single probe point so that none of the signals are communicated to the single probe point, and wherein the amplifier is coupled to the multiplexer output for amplifying a signal carried on the selected signal line of the receiver and communicating the amplified signal to a test pad on the external surface of the integrated circuit;

a package substrate having a plurality of signal contacts on a chip side of the package substrate contacting the signal pads on the integrated circuit chip, a test contact on the chip side of the package substrate for contacting the test pad on the supported integrated circuit chip, a plurality of signal conductors extending through the package substrate from the plurality of signal contacts to a board side of the package substrate, and an externally-accessible probe point on the package substrate in communication with the test contact;

a controller coupled through a bus to the multiplexer for selecting one of the plurality of signal lines to test; and a probe for contacting the externally accessible probe point, wherein the probe communicates with an oscilloscope for analyzing the signal at the externally accessible probe point.

7. The system of claim 6, wherein the bus in an inter-integrated circuit bus.

8. The system of claim 6, further comprising:

a printed circuit board having a physical opening therethrough, wherein the package substrate is secured to the printed circuit board with the externally-accessible probe point on the package substrate accessible through the physical opening.

* * * * *